(12) United States Patent
Boie et al.

(10) Patent No.: US 6,922,499 B2
(45) Date of Patent: Jul. 26, 2005

(54) MEMS DRIVER CIRCUIT ARRANGEMENT

(75) Inventors: Robert Albert Boie, Bridport, VT (US); Jungsang Kim, Basking Ridge, NJ (US); Hyongsok Soh, Basking Ridge, NJ (US)

(73) Assignees: Lucent Technologies Inc., Murray Hill, NJ (US); Agere Systems Inc., Allentown, PA (US)

( * ) Notice: Subject to any disclaimer, the term of this patent is extended or adjusted under 35 U.S.C. 154(b) by 267 days.

(21) Appl. No.: 09/911,601

(22) Filed: Jul. 24, 2001

(65) Prior Publication Data

US 2005/0111786 A1 May 26, 2005

(51) Int. Cl.$^7$ ............................................... H01L 23/02
(52) U.S. Cl. .......................... 385/18; 385/92; 257/678; 257/773; 257/777
(58) Field of Search ............................. 385/11, 16, 18, 385/88–94, 134, 135, 147; 257/773–781, 678

(56) References Cited

U.S. PATENT DOCUMENTS 6,638,784 B2 * 10/2003 Bartlett et al. ................. 438/51

2003/0102572 A1 * 6/2003 Nathan et al. ............... 257/780

FOREIGN PATENT DOCUMENTS

JP 2003-75741 * 3/2003 ........... G02B/26/08

* cited by examiner

*Primary Examiner*—John D. Lee
(74) *Attorney, Agent, or Firm*—Eugene J. Rosenthal

(57) ABSTRACT

A packaged MEMS device containing the micro mirrors has mounted on it at least two distinct integrated circuit chips, at least one of which contains the low-voltage digital-to-analog converts and at least one of which contains the high-voltage amplifiers. The integrated circuit chips may be mounted directly to the MEMS package, or they may be indirectly mounted thereto, e.g., by being directly mounted to a multi-chip module which is in turn mounted on the package. Thus, the MEMS package is employed in a dual role, 1) that of package for the MEMS device and 2) the role of a backplane in that it contains mounting places and the wires interconnecting the MEMS device and chips or modules containing the low-voltage digital-to-analog converters and the high-voltage amplifiers.

36 Claims, 5 Drawing Sheets

MEMS DRIVER CIRCUIT ARRANGEMENT

TECHNICAL FIELD

This invention relates to the art of optical systems generally, and more specifically, to switching and/or processing of optical signals using micro-electromechanical systems (MEMS).

BACKGROUND OF THE INVENTION

Optical switching using micro-electromechanical systems (MEMS) employs multiple micro mirrors that route signals carried on light beams from a fiber in a source bundle to a fiber in a destination bundle, each fiber being a port of the switch. The micro mirrors are typically electrostatically actuated and electronically controlled using various voltages, e.g., each micro mirror may require four independent voltages that are applied to various control electrodes so that the micro mirror may be operated through its full range of motion.

As the number of ports in a switch grows larger it becomes more difficult to couple the controlling voltages to the locations at which the electrodes are located on the substrate on which the micro mirrors are built. For example, for an array of 1200 input ports and 1200 output ports, which requires 1200 micro mirrors, 4800 electrodes must have voltages supplied to them. Using conventional techniques, which couple the voltage from the control circuits to the MEMS chip containing the micro mirrors using individual discrete wires, there are several failure modes that are exacerbated as the number of wires increases. Most importantly, since the failure probability of the electrical connections is relatively high, it is likely that if there is to be a failure in the switching system it will be caused by a failure of one of the connections. Multiplexing between the amplifiers generating the driving voltages and the electrodes is not possible, because if the voltage is not continually maintained the micro mirror will move, which will result in poor or lost optical connections.

One conventional approach that may be explored is to integrate the driving circuits onto the same substrate as the micro mirrors, or to directly couple the driving circuits to the substrate of the micro mirrors, e.g., using flip-chip or bump-bonding technology. Doing so would appear to provide several advantages of the device level, namely, it would a) reduce the number of connections, b) allow the use of high density wire routing on silicon using fine linewidth lithography, and c) reduce the number of wires that go to the micro mirror substrate by using multiplexing in the digital domain and employing demultiplexing on the substrate before the digital to analog conversion process is performed to generate each electrode's voltage.

SUMMARY OF THE INVENTION

We have recognized that while the conventional approach of integrating the driving circuits with the same substrate as the micro mirrors has advantages at the device level, at the system level it suffers from significant drawbacks. In particular, it results in a coupling of the failure modes, so that when one part of the integrated driver and micro mirrors fails the entire device needs to be replaced, unless there is redundancy built into the system.

However, the cost of such redundancy is high at the system level. This is because the optical switch is made up of two sets of opposing micro mirrors that cooperate to switch light from any input port to any output port, and when the micro mirror and driver unit is assembled the resulting system needs to be aligned to achieve the best possible optical connections. To this end it must be determined that voltages need be applied to the electrodes of each micro mirror to achieve the best connection between it and each other micro mirror of the opposing set, as well what voltage needs to be applied to the electrodes of each of the opposing micro mirrors. This process of determining the voltages is known as "training".

When redundancy is built into the system there are extra ports for which alignment voltages need to be determined. Determining these voltages is very time consuming, and consequently very expensive, so that extra micro mirrors results in increased cost. Furthermore, to utilize the redundant micro mirrors the connection which supplies or receives the light to/from the fiber that makes up the port whose micro mirror has failed must be changed upstream/ downstream from the switch. This may need to be done physically and manually, adding to the cost.

In the event that the failure is greater in magnitude than can be handled by any redundant ports, at least one entire micro mirror and driver unit will have to be replaced. While the material cost of doing so may not be that great, as with the assembly of a new switch the entire alignment process needs to be performed, to ensure proper cooperation between the old and new units. Unfortunately, as noted, the cost of performing such alignment is very high.

Combining the micro mirrors and the drivers can also cause thermal problems. More specifically, the electronics of the driver will heat up. Depending on how many of the micro mirrors are in use, the heat generated may vary. This heat may be coupled to the micro mirror portion of the integrated unit. Unfortunately, with conventional technology, the performance and lifetime of the micro mirror are dependent on the operating temperature of the micro mirror. Both performance and lifetime of the micro mirrors are better with lower temperature. Thus, it is better to maintain constant temperature which is a low as possible within the operating range, e.g., the lower end of so-called "room temperature".

Another problem that we have recognized with the conventional approach of integrating the driving circuits with the same substrate as the micro mirrors is that the electrostatic voltages which are employed to move the micro mirrors must be quite high, e.g., on the order of 150 to 200 volts. These control voltages are generated by converting a digital control signal to a low-voltage analog control signal using a digital-to-analog converter and then amplifying the low-voltage analog control signal to the required high-voltage control signal using a voltage amplifier. However, the conventionally-available fabrication technology for making the low-voltage digital-to-analog converts and the conventionally-available fabrication technology for making the high-voltage amplifiers are not compatible, e.g., due to different requirements for a) the minimum line width and b) the level of isolation. Furthermore, the conventional micro mirror fabrication technology is incompatible with the fabrication technology of both the low-voltage digital-to-analog converters and the high-voltage amplifiers.

Even in the future, when it may be possible to reduce the maximum required control voltage, it is anticipated that the voltages that are produced by the digital-to-analog converters will also be reduced. Thus, herein, high voltage is considered to be any voltage level that is higher than the supply voltage of the digital-to-analog converters employed, which is considered to be low voltage.

Lastly, it is anticipated that, by making the device so complicated, the overall yield of fully functioning integrated devices is likely to be lower than for separate components, since a failure of any part results in a failure of the entire device.

Although the foregoing has been described in terms of optical switching, the same types of problems result from other optical processing that employ MEMS devices to process various beams that are optical signals.

Therefore, in accordance with the principles of the invention, a packaged MEMS device has mounted on it at least two distinct integrated circuit chips, at least one of which contains the low-voltage digital-to-analog converters and at least one of which contains the high-voltage amplifiers. The integrated circuit chips may be mounted directly to the MEMS package, or they may be indirectly mounted thereto, e.g., by being directly mounted to a multi-chip module which is in turn mounted on the package. Thus, the MEMS package is employed in a dual role, 1) that of package for the MEMS device and 2) the role of a backplane in that it contains mounting places and the wires interconnecting the MEMS device and chips or modules containing the low-voltage digital-to-analog converters and the high-voltage amplifiers.

Note that by a packaged MEMS device it is generally intended to encompass any structure to which a MEMS device is mounted. Such packaging is typically employed to bring the electrical connections off of the MEMS chip and to control the environment in which the MEMS chip operates.

Advantageously, since separate integrated circuit chips are employed, each type of chip can use the appropriate processing techniques that best suits it functionality so as to achieve a low cost for that functionality, e.g., low voltage processes for the low-voltage digital-to-analog converters and high voltage processes for the high-voltage amplifiers. Further advantageously, the number of wires which is required to leave the combined structure is significantly reduced over the number of wires that would have been required to leave the MEMS device alone.

In one embodiment of the invention, the packaged MEMS device further has mounted thereto, either directly or indirectly, circuitry for demultiplexing digital control signals which are then distributed to various ones of the low-voltage digital-to-analog converters. Advantageously, employing such demultiplexing circuitry can even further reduce the number of wires that are required to leave the combined structure even beyond the number which would have been required had demultiplexing not been employed.

Another advantage of the invention is that in the event of a failure of a digital-to-analog converter or a high-voltage amplifier, only the chip or module containing the failed element need be replaced. Furthermore, training of the overall system can be avoided by calibrating the replacement chip to correspond substantially exactly to the failed one, so that performance substantially identical to the failed chip is achieved by the replacement chip.

In one embodiment of the invention, when the MEMS device contains micro mirrors, the integrated circuits are mounted to the side of the MEMS device package that is opposite to the side which is exposing the micro mirrors of the MEMS device, and such a MEMS device package as referred to as a "midplane". Interconnections among the chips and/or modules may be achieved using wires routed on the package to provide resource sharing or greater overall functionality.

An additional advantage of the invention is that, on a practical system design level, the number of connectors, i.e., removable interconnections through which a signal passes, for each signal may be reduced. Yet another advantage of the invention is that thermal problems are reduced since the thermal energy may be dissipated over the entire MEMS device package rather than only on the substrate of the MEMS device itself.

DETAILED DESCRIPTION

Figure 1:
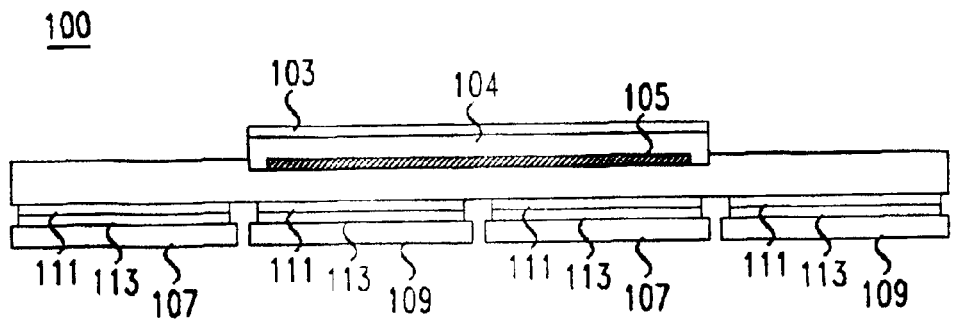
FIG. 1 shows a cross-sectional view of integrated MEMS-electronics assembly which contains a packaged MEMS device having mounted on it at least two distinct integrated circuit chips, at least one of which contains the low-voltage digital-to-analog converters and at least of which contains the high-voltage amplifiers, in accordance with the principles of the invention.

The following merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes to aid the reader in understanding the principles of the invention and the concepts contributed by the inventor(s) to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that any block diagrams herein represent conceptual views of illustrative circuitry embodying the principles of the invention.

In the claims hereof any element expressed as a means for performing a specified function is intended to encompass any way of performing that function including, for example, a) a combination of circuit elements which performs that function or b) software in any form, including, therefore, firmware, microcode or the like, combined with appropriate circuitry for executing that software to perform the function. The invention as defined by such claims resides in the fact that the functionalities provided by the various recited means are combined and brought together in the manner which the claims call for. Applicant thus regards any means which can provide those functionalities as equivalent as those shown herein.

Unless otherwise explicitly specified herein, the drawings are not drawn to scale.

Additionally, unless otherwise explicitly specified herein, any lens shown and/or described herein is actually an optical system having the particular specified properties of that lens. Such an optical system may be employed by a single lens element but is not necessarily limited thereto. Similarly, where a mirror is shown and/or described what is actually being shown and/or described is an optical system with the specified properties of such a mirror, which may be implemented by a single mirror element but is not necessarily limited to a single mirror element. This is because, as is well known in the art, various optical systems may provide the same functionality of a single lengths element or mirror but in a superior way, e.g., with less distortion. Furthermore, as is well known in the art, the functionality of a curved mirror may be realized via a combination of lenses and mirrors and vice versa. Moreover, any arrangement of optical components that are performing a specified function, e.g., an imaging system, gratings, coated elements, and prisms, may be replaced by any other arrangement of optical components that perform the same specified function. Thus, unless otherwise explicitly specified here, all optical elements or systems that are capable of providing specific function within an overall embodiment disclosed herein are equivalent to one another for purposes of the present disclosure.

The term micro-electromechanical systems (MEMS) device as used herein is intended to mean an entire optical MEMS device or any portion thereof. An optical MEMS device is a MEMS device that is used in connection with optical signals or light of some type. An optical MEMS device may, but need not, employ micro mirrors. Thus, if a portion of MEMS device is inoperative, or if a portion of a MEMS device is occluded, such as MEMS device is nonetheless considered to be a MEMS device for purposes of the present disclosure.

FIG. 1 shows a cross-sectional view of integrated MEMS-electronics assembly 100 which a) contains a packaged MEMS device and b) has mounted on it at least two distinct integrated circuit chips, at least one of which contains the low-voltage digital-to-analog converters and at least of which contains the high-voltage amplifiers, in accordance with the principles of the invention. Generally, the integrated circuit chips may be mounted directly to the MEMS package, or they may be indirectly mounted thereto, e.g., by being directly mounted to a multi-chip module which is mounted on the package.

Shown in FIG. 1 is MEMS package 101 into space 104 of which is inserted MEMS device 105. MEMS package 101 generally encompasses any structure to which a MEMS device is mounted. Such packaging is typically employed to bring the electrical connections off of the MEMS chip and to control the environment in which the MEMS device operates. MEMS package 101 is typically manufactured from a ceramic material since it provides the advantages of a) an ability to be hermetically sealed, b) good heat dissipation properties, c) good mechanical strength, and d) good inside wiring density. Space 104 may be hermetically sealed by optical sealing window 103 to provide a controlled operating environment for MEMS device 105. MEMS device 105 may contain micro mirrors e.g., for use in optical switching, or other optical components for use in optical processing.

Furthermore, mounted to package 101, in accordance with the principles of the invention, are low-voltage digital-to-analog converter chips mounted on digital-to-analog converter modules 107 and high-voltage amplifier chips mounted on high-voltage amplifier modules 109. Each module is mounted by one of connectors 111, e.g., sachets, which are integrated with MEMS package 101. Connectors 111 may receive matching connectors 113. Thus, MEMS package 101 is employed in a dual role, 1) that of package for MEMS device 105 and 2) the role of a backplane in that it contains mounting places and the wires interconnecting MEMS device 105 with digital-to-analog converter modules 107 and high-voltage amplifier modules 109. Thus, MEMS package 101, as arranged in FIG. 1, is referred to as a "midplane".

Since separate integrated circuit chips are employed in the modules, advantageously, each type of chip can use the appropriate processing techniques that best suit its functionality so as to achieve a low cost for that functionality, e.g., low voltage processes for the low-voltage digital-to-analog converters and high voltage processes for the high-voltage amplifiers. Furthermore, in one embodiment of the invention, MEMS package 101 may have mounted thereon modules for demultiplexing digital control signals which are then distributed to various ones of digital-to-analog converter modules 107. Advantageously, employing such demultiplexing modules can even further reduce the number of wires that are required to leave the combined structure even beyond the number which would have been required had demultiplexing not been employed.

Figure 2:
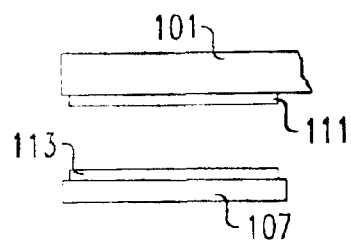
FIG. 2 shows an enlarged view of one embodiment of connectors shown in FIG. 1.
Figure 3:
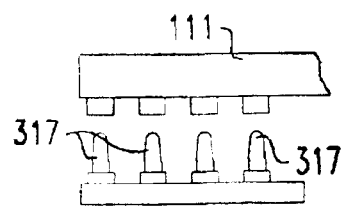
FIG. 3 shows an enlarged view of an embodiment of a connector of FIG. 1 which does not require a matching connector on the integrated circuit mated to it but instead receives pins of the integrated circuit directly.
Figure 4:
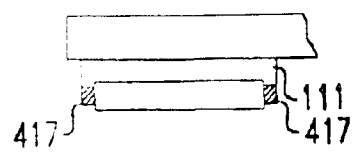
FIG. 4 shows an enlarged view of an embodiment of a connector of FIG. 1 which does not require a matching connector on the integrated circuit mated to it, but instead matches directly contacts on the integrated circuit.

FIG. 2 shows an enlarged view of one embodiment of connectors 111 and 113 in which the connectors are separated, although the details of the interconnects are not shown. FIG. 3 shows an enlarged view of an embodiment of connector 111 which does not require a matching connector 113 on the integrated circuit mated to it but instead receives pins 317 of the integrated circuit directly. FIG. 4 shows an enlarged view of an embodiment of connector 111 which does not require a matching connector 113 on the integrated circuit mated to it, but instead matches directly to contacts 417 on the integrated circuit.

Figure 5:
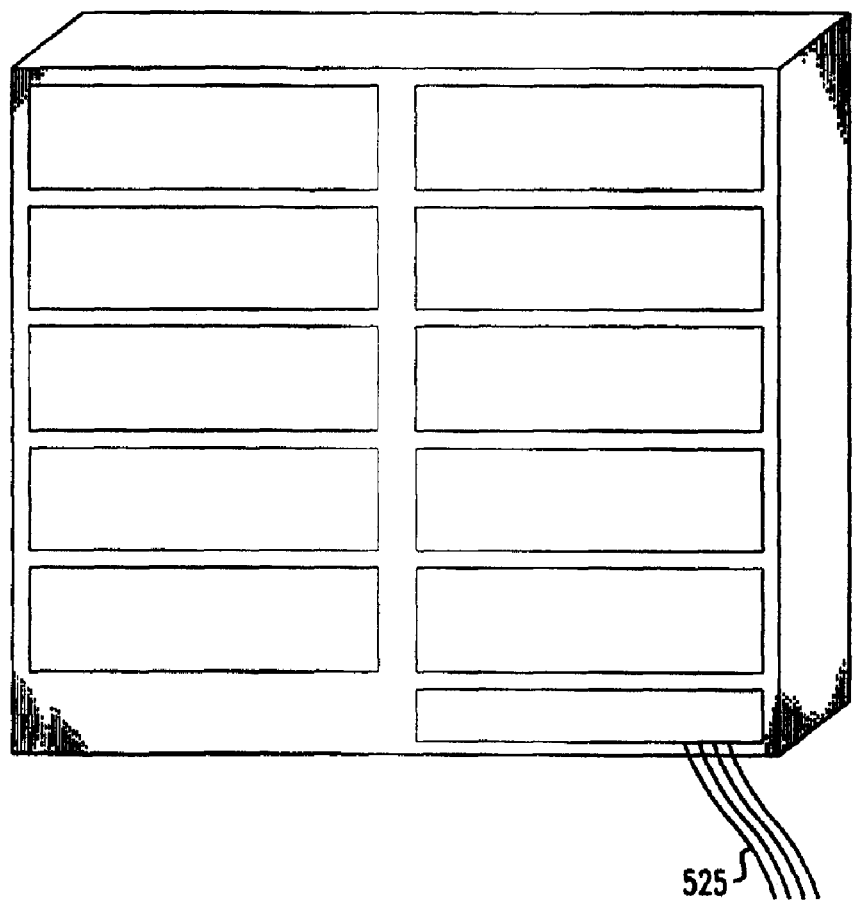
FIG. 5 shows another view of the package of FIG. 1.

FIG. 5 shows a view of package 101 looking at it toward the face opposite that onto which is mounted window 103 and onto which is mounted various integrated circuits or multi-chip modules. FIG. 5 further shows wires 525 which bring signals as input onto package 101 and via which signals may be removed as outputs from package 101. The actual interconnection wires between the integrated circuits and wires 525, as well as between the integrated circuits themselves and between the integrated circuits and the MEMS device, are not visible in FIG. 5 because they are routed within package 101, i.e., underneath the exterior surface of package 101. In other embodiments of the invention some of the interconnection wires, or additional interconnection wires, could be run on the surface of package 101 so as to be visible in the view of FIG. 5. Advantageously, the number of wires 525 which is required is significantly reduced over the number of such wires that would have been required if only MEMS device 105 were mounted on package 101.

Figure 6:
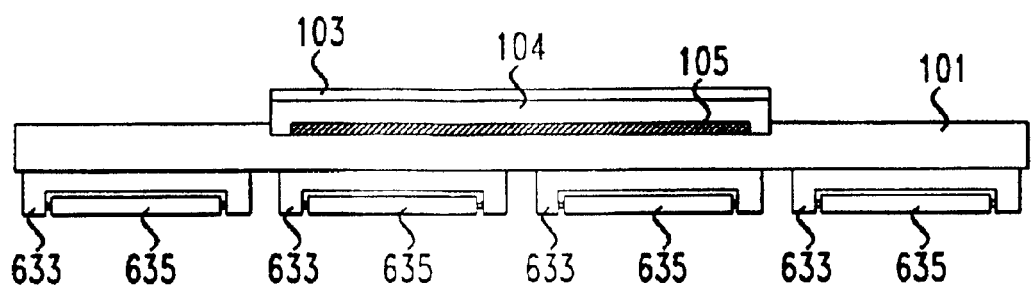
FIG. 6 shows another embodiment of the invention in which each of what appears to be a single integrated circuit chip is mounted within an individual integrated circuit sockets.

FIG. 6 shows another embodiment of the invention in which each of what appears to be a single integrated circuit chip 635 is mounted within one of individual integrated circuit sockets 633. Each of what appears to be a single integrated circuit chip 635, i.e., it appears externally to be a single conventional integrated circuit, may circuit contain inside of it only a single integrated circuit, e.g., containing low-voltage digital-to-analog converters or only high-voltage amplifiers. Alternatively, each of what appears to be a single integrated circuit chip 635 may actually contain inside of it two or more integrated circuit chips, e.g., one integrated circuit chip containing only low-voltage digital-to-analog converters and one integrated circuit chip containing only high-voltage amplifiers. In yet a further embodiment of the invention, it is possible for each of what appears to be a single integrated circuit chip 635 to actually be a single integrated circuit chip containing both low-voltage digital-to-analog converters and high-voltage amplifiers.

In a further embodiment of the invention, some of what appears to be a single integrated circuit chip 635 may include thereon an integrated circuit for demultiplexing digital control signals which are then distribute to various ones of the digital-to-analog converter. The integrated circuit for demultiplexing may be alone within the ones of what appears to be a single integrated circuit chip 635 or they may be within a one of what appears to be a single integrated circuit chip 635 that further contains low-voltage digital-to-analog converters and/or high-voltage amplifiers. Again, advantageously, employing such demultiplexing can even further reduce the number of wires that are required to leave the combined structure even beyond the number which would have been required had demultiplexing not been employed.

Figure 7:
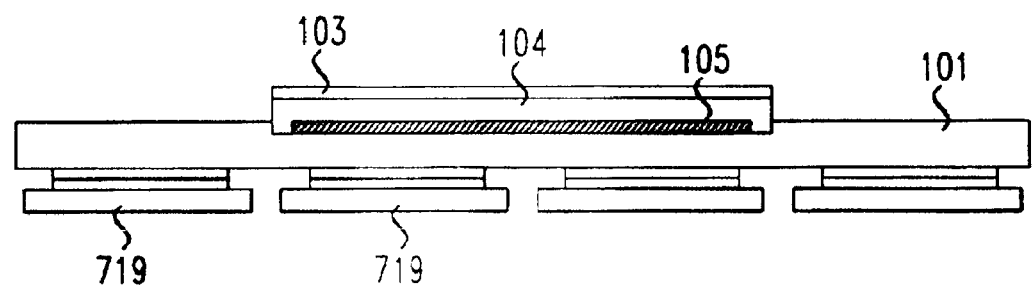
FIG. 7 shows an embodiment of the invention in which various mixed modules are mounted to the package.

In FIG. 1, each of the modules the mounted thereon only a single type of integrated circuit. However, such need not be the case. Thus, shown in FIG. 7 is an embodiment of the invention in which various mixed modules 719 are mounted to MEMS package 101. Each of mixed modules 719 may contain one or more integrated circuit chips from at least two different categories, e.g., low-voltage digital-to-analog converters, high-voltage amplifiers, and demultiplexers. Mixed modules 719 are coupled to MEMS package 101 in the same manner as modules 107 (FIG. 1) and 109 are coupled to MEMS package 101.

Figure 8:
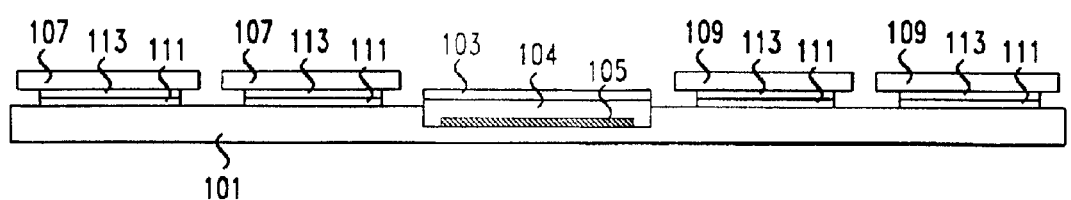
FIG. 8 shows an embodiment of the invention in which the integrated circuits are mounted to the same side of the package as is the MEMS device.
Figure 9:
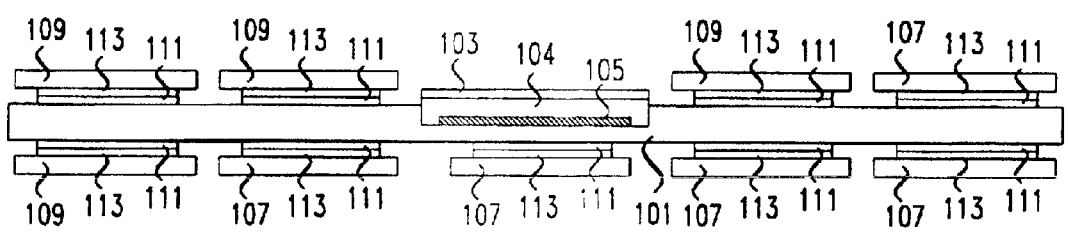
FIG. 9 shows an embodiment of the invention in which the integrated circuits are mounted to two sides of the package.

FIG. 8 shows an embodiment of the invention in which the integrated circuits are mounted to the same side of MEMS package 101 as that on which MEMS device 105 is mounted. FIG. 9 shows an embodiment of the invention in which the integrated circuits are mounted to two sides of MEMS package 101. Those of ordinary skill in the art will recognize that other sides of the MEMS package 101 may be employed as well. Note that although the MEMS device is shown having its optically active area, e.g., its micro mirrors, face only a single side of MEMS package 101, this need not be the case. Instead, the optically active area may face more than one side.

An advantage of the invention is that in the event of a failure a digital-to-analog converter or a high-voltage amplifier, only the chip or module containing the failed element need be replaced because of the modularity of the resulting designs.

Figure 10:
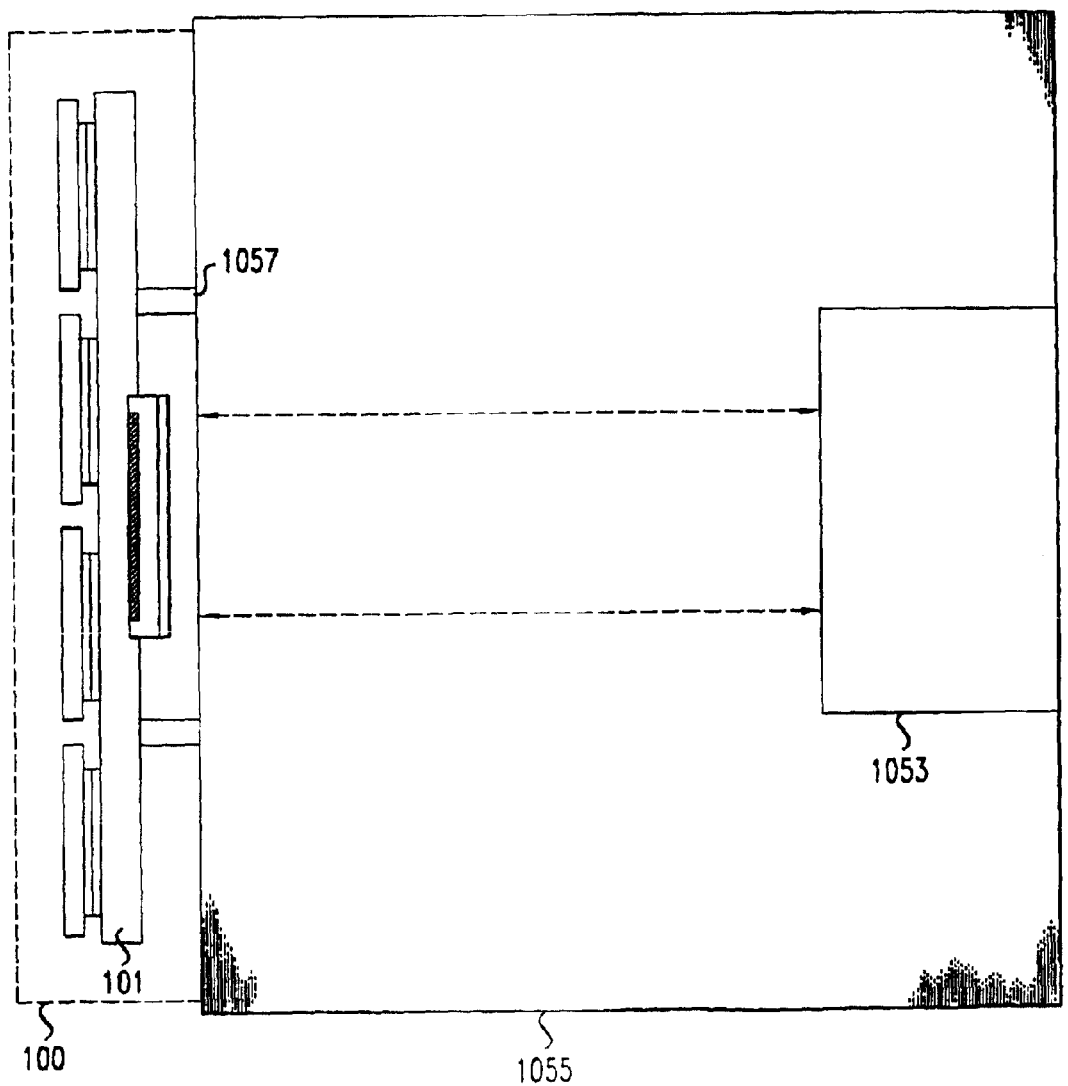
FIG. 10 shows an optical assembly which includes an embodiment of the invention which is optionally coupled to other optical components.

FIG. 10 shows optical assembly 1000, which includes an embodiment of the invention, e.g., integrated MEMS-electronics assembly 100, which is optically coupled to other optical components 1053, which may be another partial integrated MEMS-electronics assembly. Integrated MEMS-electronics assembly 100 and other optical components 1053 are typically mounted to housing 1055, or optionally some other optical frame, to be in critical optical alignment. Integrated MEMS-electronics assembly 100 may be mounted to housing 1055 using mechanical attachments 1057, e.g., screws, brackets, welds, glue, standoffs, bolts, etc., or any combination thereof. By critical optical alignment it is meant that a prescribed relative position is maintained between a prescribed point, e.g., the center, of each of the micro mirrors of MEMS chip 105 and a prescribed position on other optical components 1053.

Because of variations in the manufacture and assembly of the various components that make up optical assembly 1000, it is necessary to determine the control signal, e.g., voltage that need be applied to each electrode, of each micro mirror to achieve the best performance of optical assembly 1000. This process of determining each control signal is known as "training". Training can be a time consuming and expensive process. Using the conventional prior art suggested all-integrated approach, e.g. the MEMS device mounted on the same substrate as the low-voltage digital-to-analog converters, high-voltage amplifiers, and/or demultiplexers, any time there is a failure in the driver electronics the MEMS device will have to be replaced with a substitute device. Unfortunately, the substitute MEMS would have properties different than the MEMS device it replaced, and therefore, the entire training process would have to be repeated.

Advantageously, by employing the instant invention when there is a failure in the driver electronics, only the failed electronic component need be replaced. The MEMS device can remain in place. Thus, the need for retaining the system is eliminated. However, it is necessary that the replacement electronic component be calibrated to function so as to supply at its output a control signal which is identical to the one that would have been provided in the circumstances by the component it replaced. This may be achieved easily by the driving software prescribing the appropriate input value to the replacement component. In other words, the inputs provided to the electronics by the software are adjusted to achieve the same output by the electronics for a desired micro mirror position as if a prescribed value had been supplied to the original component. To this end, it is necessary to characterize each electronic device when the system is initially trained.

Although training has been described herein in the context of MEMS devices with micro mirrors, it may be necessary to train other MEMS device that do not have micro mirrors.

What is claimed is:

1. A packaged micro electrical mechanical system (MEMS) device, comprising:

a packaging within which is mounted at least one optical MEMS device; and at least two distinct integrated circuit chips, a first one of said integrated circuit chips containing low-voltage digital-to-analog converters and a second one of said integrated circuit chips containing high-voltage amplifiers, said at least two distinct integrated circuit chips being mounted upon said packaging.

2. The invention as defined in claim 1 wherein said high voltage is any voltage level higher than said low voltage, said low voltage being a supply voltage of said first one of said integrated circuit chips containing low-voltage digital-to-analog converters.

3. The invention as defined in claim 1 wherein at least one of said at least two distinct integrated circuit chips is directly mounted upon said packaging.

4. The invention as defined in claim 1 wherein at least one of said at least two distinct integrated circuit chips is indirectly mounted upon said packaging.

5. The invention as defined in claim 1 wherein at least one of said at least two distinct integrated circuit chips is mounted on a multi-chip module which is mounted upon said packaging.

6. The invention as defined in claim 1 wherein said at least one optical MEMS device includes micro mirrors.

7. The invention as defined in claim 6 wherein said micro mirrors are arranged to reflect light approaching said packaging from a first side thereof and at least one of said integrated circuit chips is mounted to the side of said packaging that is opposite to said first side.

8. The invention as defined in claim 6 wherein said micro mirrors are arranged to reflect light approaching said packaging from a first side thereof and at least one of said integrated circuit chips is mounted to said first side.

9. The invention as defined in claim 6 wherein said micro mirrors are arranged to reflect light approaching said packaging from both a first side thereof and a second side thereof and at least one of said integrated circuit chips is mounted to said first side and at least another of said integrated circuit chips is mounted to said second side.

10. The invention as defined in claim 6 wherein said high-voltage amplifiers are adapted to supply driving voltages for controlling a position of said micro mirrors.

11. The invention as defined in claim 1 further comprising wires routed on said packaging whereby at least one interconnection is made between said integrated circuit chips.

12. The invention as defined in claim 1 further comprising wires routed on said packaging whereby at least one interconnection is made between said at least one said MEMS device to one of said integrated circuit chips.

13. The invention as defined in claim 1 further comprising at least one electrical connector coupling said at least one of said integrated circuits circuit chips physically to said packaging and electrically to said MEMS device.

14. The invention as defined in claim 1 further comprising at least one electrical connector coupling at least one of said integrated circuit chips physically to said packaging and electrically to another of said integrated circuit chips.

15. The invention as defined in claim 1 further comprising at least one connector adapted to mount at least one of said integrated circuit chips on said packaging.

16. The invention as defined in claim 15 wherein said at least one connector is integrated with said packaging.

17. The invention as defined in claim 1 further comprising at least one connector coupled to at least one of said integrated circuit chips and being adapted for mounting said at least one integrated circuit chip on said packaging.

18. The invention as defined in claim 1 wherein at least one of said integrated circuit chips includes demultiplexing circuits.

19. The invention as defined in claim 1 further comprising at least a third integrated circuit chip electrically coupled to at least one of said at least two integrated circuit chips, said third integrated circuit chip being mounted to said packaging and including demultiplexing circuits.

20. The invention as defined in claim 19 wherein said third integrated circuit chip is directly mounted upon said packaging.

21. The invention as defined in claim 19 wherein at least one of said at least two distinct integrated circuit chips is indirectly mounted upon said packaging.

22. The invention as defined in claim 19 wherein said third integrated circuit chip is mounted on a multi-chip module which is mounted upon said packaging.

23. The invention as defined in claim 19 wherein said third integrated circuit chip is mounted on a multi-chip module upon which is also included at least one of said at least two distinct integrated circuit chips, said multi-chip module being mounted upon said packaging.

24. A packaged micro electrical system (MEMS) device, comprising a packaging within which is mounted micro mirrors contained within at least one MEMS device, said packaging being adapted to have mounted thereon at least two distinct integrated circuit chips, a first one of said integrated circuit chips containing low-voltage digital-to-analog converters and a second one of said integrated circuit chips containing high-voltage amplifiers.

25. A packaged micro electrical mechanical systems (MEMS) device, comprising means for packaging at least one optical MEMS device; and means for mounting upon said means for packaging at least two distinct integrated circuit chips, a first one of said integrated circuit chips containing low-voltage digital-to-analog converters and a second one of said integrated circuit chips containing high-voltage amplifiers.

26. The invention as defined in claim 25 wherein said at least one optical MEMS device contains at least one micro mirror.

27. The invention as defined in claim 25 further comprising means for electrically coupling at least one of said at least two distinct integrated circuit chips to said at least one optical MEMS device.

28. The invention as defined in claim 25 further comprising means for electrically coupling one of said at least two distinct integrated circuit chips to at least another of said at least two distinct integrated circuit chips.

29. The invention as defined in claim 25 further comprising means for mounting upon said means for packaging at least one integrated circuit chip that performs demultiplexing.

30. A method for forming a packaged micro electrical mechanical system (MEMS) device, the method comprising the steps of:

mounting at least one optical MEMS device within a package; and mounting at least two distinct integrated circuit chips to said package, a first one of said integrated circuit chips containing low-voltage digital-to-analog converters and a second one of said integrated circuit chips containing high-voltage amplifiers.

31. The invention as defined in claim 30 further comprising the step of placing said first and said second integrated circuit chips within a module prior to mounting them to said package in said step of mounting at least two distinct integrated circuit chips to said package.

32. The invention as defined in claim 30 wherein said micro electrical mechanical system (MEMS) device is optically coupled to at least one other device to form a system that has been trained, said method further comprising the steps of:

replacing one of said first and second integrated circuit chips so that said system operates as it did prior to executing said replacing step without requiring said system to be trained after said replacing step.

33. The invention as defined in claim 30 wherein said micro electrical mechanical system (MEMS) device is optically coupled to at least one other device to form a system that has been trained, and wherein one of said first and second integrated circuit chips when supplied with each of a set of first prescribed values as an input generates a respective corresponding output, said method further comprising the steps of:

replacing one of said first and second integrated circuit chips; and employing a set of replacement prescribed values with each value in said set of replacement prescribed values having a respective corresponding prescribed value in said set of first prescribed values, each of said replacement prescribed values being such as to cause said replaced one of said first and second integrated circuit chips to supply the same output as said one of said first and second integrated circuit chips which was replaced would have supplied had the corresponding value of said set of first prescribed values been supplied to said replaced one of said first and second integrated circuit chips;

whereby no training is required after said replacing step.

34. A packaged micro electrical mechanical system (MEMS) device, comprising a packaging within which is mounted at least one optical MEMS device, said packaging having mounted thereon at least one integrated circuit chip made up of a substrate distinct from said packaging and including at least two electrical circuit devices, said packaging being adapted to maintain said at least one optical MEMS device in a prescribed optical relationship with at least one other optical component.

35. A packaged micro electrical mechanical system (MEMS) device, comprising a packaging within which is mounted at least one optical MEMS device, said packaging being adapted to have mounted thereon at least one integrated circuit chip, said packaging being adapted to maintain said at least one optical MEMS device in a prescribed optical relationship with at least one other optical component, wherein said at least one integrated circuit chip comprises at last a first integrated circuit chip containing low-voltage digital-to-analog converters and a second integrated circuit chip containing high-voltage amplifiers.

36. A packaged micro electrical mechanically system (MEMS) device, comprising a packaging within which is mounted at least one optical MEMS device, said packaging being adapted to have mounted thereon at least one integrated circuit chip, wherein said at least one integrated circuit chip includes circuitry of at least one of the type of the set consisting of low-voltage digital-to-analog converters, high-voltage amplifiers, and demultiplexers.

* * * * *